(12) United States Patent
Hill et al.

(10) Patent No.: US 11,368,136 B2
(45) Date of Patent: Jun. 21, 2022

(54) ALTERNATIVE TEMPERATURE COMPENSATING MATERIALS TO AMORPHOUS SILICA IN ACOUSTIC WAVE RESONATORS

(71) Applicant: SKYWORKS SOLUTIONS, INC., Irvine, CA (US)

(72) Inventors: Michael David Hill, Emmitsburg, MD (US); Peter Ledel Gammel, Lynnfield, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 803 days.

(21) Appl. No.: 16/203,813

(22) Filed: Nov. 29, 2018

(65) Prior Publication Data

US 2019/0173449 A1 Jun. 6, 2019

Related U.S. Application Data

(60) Provisional application No. 62/593,329, filed on Dec. 1, 2017.

(51) Int. Cl.
*H03H 9/02* (2006.01)
*H01L 41/08* (2006.01)

(52) U.S. Cl.
CPC .... *H03H 9/02102* (2013.01); *H03H 9/02015* (2013.01); *H03H 9/02834* (2013.01); *H01L 41/0805* (2013.01)

(58) Field of Classification Search
CPC ............ H03H 9/02102; H03H 9/02015; H01L 41/0805
See application file for complete search history.

(56) References Cited

U.S. PATENT DOCUMENTS 5,196,381 A * 3/1993 Hu ..................... C03C 10/00
501/10
6,950,584 B1* 9/2005 Suzuki ............... G02B 26/0808
385/122

(Continued)

FOREIGN PATENT DOCUMENTS

CN 1054055 A 8/1991
JP 2010287496 A * 12/2010

OTHER PUBLICATIONS

International Search Report and Written Opinion from corresponding International Application No. PCT/US2018/063006 dated Mar. 22, 2019.

*Primary Examiner* — Bryan P Gordon
(74) *Attorney, Agent, or Firm* — Lando & Anastasi, LLP

(57) ABSTRACT

An acoustic wave device comprises a piezoelectric material and a second material disposed on the piezoelectric material and having a temperature coefficient of frequency of a sign opposite a sign of a temperature coefficient of frequency of the piezoelectric material, the second material including one or more of $Si_{1-x-y}Ti_xP_yO_{2-z}F_z$ (x,y,z<0.1), $Si_{1-x-y}Ge_xP_yO_{2-z}F_z$, $Si_{1-x-y}B_xP_yO_{2-z}F_z$ (x=y<0.04), $Si_{1-3x}Zn_xP_{2x}O_{2-y}F_y$, $Si_{1-x}P_xO_{2-y}F_y$, $Si_{1-2y}Ga_xP_xO_4$, $Si_{1-2y}Ga_{y-x}B_xP_yO_4$, $Si_{1-2y}Ga_{y-x}B_xP_yO_{4-z}F_z$, $TiNb_{10}O_{29}$, $Si_{1-x}Ti_xO_{2-y}F_y$, $Si_{1-x-y}Ti_xP_yO_2$, $Si_{1-x}B_xO_{2-y}F_y$, $Si_{1-x-y}B_xP_yO_2$, $GeO_2$, $GeO_{2-y}F_y$, $Si_{1-x}Ge_xO_2$, $Si_{1-x}Ge_xO_{2-y}F_y$, $Si_{1-x-y}Ge_xP_yO_2$, $ZnP_2O_6$, $Si_{1-3x}Zn_xP_{2x}O_2$, $Ge_{1-3x}Zn_xP_{2x}O_2$, $TeO_x$, $Si_{1-x}Te_xO_{2+y}$, $Ge_{1-x}Te_xO_{2+y}$, $Si_{1-3x-y}Ge_yZn_xP_{2x}O_2$, $Si_{1-x}P_xO_{2-x}N_x$, Si—O—C, $i_{1-2y}Al_xP_xO_4$, or $BeF_2$.

22 Claims, 6 Drawing Sheets

(56) References Cited

U.S. PATENT DOCUMENTS

| | | | |
|---|---|---|---|
| 2007/0120625 A1 | 5/2007 | Larson et al. | |
| 2012/0232332 A1* | 9/2012 | Mersky | H04R 25/606 |
| | | | 600/25 |
| 2013/0241673 A1 | 9/2013 | Yokoyama et al. | |
| 2014/0361664 A1* | 12/2014 | Taniguchi | H03H 9/02102 |
| | | | 310/346 |
| 2016/0099705 A1* | 4/2016 | Matsuda | H03H 9/171 |
| | | | 310/321 |
| 2017/0194932 A1* | 7/2017 | Ruile | H03H 9/02102 |
| 2017/0264269 A1 | 9/2017 | Lee et al. | |
| 2017/0370791 A1* | 12/2017 | Nakamura | G01L 9/0025 |
| 2019/0173449 A1* | 6/2019 | Hill | H03H 9/02015 |

\* cited by examiner

ALTERNATIVE TEMPERATURE COMPENSATING MATERIALS TO AMORPHOUS SILICA IN ACOUSTIC WAVE RESONATORS

CROSS-REFERENCE TO RELATED APPLICATIONS

This application claims priority under 35 U.S.C. § 119(e) to U.S. Provisional Patent Application Ser. No. 62/593,329, titled "ALTERNATIVE TEMPERATURE COMPENSATING MATERIALS TO AMORPHOUS SILICA IN ACOUSTIC WAVE RESONATORS", filed Dec. 1, 2017 which is incorporated by reference herein in its entirety for all purposes.

BACKGROUND

Acoustic wave resonators may include a piezoelectric material and one or more electrodes that excite an acoustic wave in the piezoelectric material. One example of an acoustic wave resonator is a surface acoustic wave (SAW) resonator. FIG. 1A is a schematic plan view of an example of a SAW resonator 10.

SAW resonator 10 is formed on a piezoelectric substrate, for example, a lithium tantalate substrate 12, and includes an Inter Digital Transducer (IDT) electrode 14 and reflector electrodes 16. In use, the IDT electrode 14 excites a main acoustic wave along a surface of the piezoelectric substrate 12. The reflector electrodes 16 sandwich the IDT electrode 14 and reflect the main acoustic wave back and forth through the IDT electrode 14.

The IDT electrode 14 includes a first bus bar electrode 18A and a second bus bar electrode 18B facing first bus bar electrode 18A. The IDT electrode 14 includes first electrode fingers 20A extending from the first bus bar electrode 18A toward the second bus bar electrode 18B, and second electrode fingers 20B extending from the second bus bar electrode 18B toward the first bus bar electrode 18A. The IDT electrode 14 also includes first dummy electrode fingers 22A extending from the first bus bar electrode 18A toward the second bus bar electrode 18B, and second dummy electrode fingers 22B extending from the second bus bar electrode 18B toward the first bus bar electrode 18A.

The reflector electrodes 16 each include a first reflector bus bar electrode 24A and a second reflector bus bar electrode 24B and reflector fingers 26 extending between and electrically coupling the first bus bar electrode 24A and the second bus bar electrode 24B.

As illustrated in FIG. 1B, which is a cross section through line 1B-1B of FIG. 1A, the electrode fingers 20A, 20B may include a single layer of metal or multiple layers of metal, for example, a lower layer 200 including or consisting of molybdenum and an upper layer 201 including or consisting of aluminum.

Piezoelectric materials typically exhibit a negative temperature coefficient of frequency. Accordingly, as the temperature of a SAW resonator increases, the resonant frequency of the SAW resonator decreases. Some dielectric materials, for example, silicon dioxide, exhibit a positive temperature coefficient of frequency. Depositing a layer of a material with a positive temperature coefficient of frequency on the piezoelectric substrate of a SAW resonator may help to cancel the effect of temperature on the resonant frequency of the SAW resonator. As illustrated in FIG. 1B, substrate 12 and electrode fingers 20A, 20B of SAW resonator 10 may be covered by a layer of dielectric 21, for example, silicon dioxide, and, optionally, a second layer of dielectric 23, for example, silicon nitride to help stabilize the frequency vs. temperature behavior of the device. A similar effect may be achieved by depositing silicon dioxide on the piezoelectric material of a bulk acoustic wave device.

It should be appreciated that the SAW resonator 10 illustrated in FIGS. 1A and 1B is illustrated in a highly simplified form. The relative dimensions of the different features are not shown to scale. Further, typical SAW resonators would commonly include a far greater number of electrode fingers and reflector fingers than illustrated. Typical SAW resonators may also include multiple IDT electrodes sandwiched between the reflector electrodes.

SUMMARY

In accordance with one aspect there is provided an acoustic wave device. The acoustic wave device comprises a piezoelectric material and a second material disposed on the piezoelectric material and having a temperature coefficient of frequency of a sign opposite a sign of a temperature coefficient of frequency of the piezoelectric material, the second material including one or more of $Si_{1-x-y}Ti_xP_yO_{2-z}F_z$ (x,y,z<0.1), $Si_{1-x-y}Ge_xP_yO_{2-z}F_z$, $Si_{1-x-y}B_xP_yO_{2-z}F_z$ (x=y<0.04), $Si_{1-3x}Zn_xP_2xO_{2-y}F_y$, $Si_{1-x}P_xO_{2-y}F_y$, $Si_{1-2y}Ga_xP_xO_4$, $Si_{1-2y}Ga_{y-x}B_xP_yO_4$, $Si_{1-2y}Ga_{y-x}B_xP_yO_{4-z}F_z$, $TiNb_{10}O_{29}$, $Si_{1-x}Ti_xO_{2-y}F_y$, $Si_{1-x-y}Ti_xP_yO_2$, $Si_{1-x}B_xO_{2-y}F_y$, $Si_{1-x-y}B_xP_yO_2$, $GeO_2$, $GeO_{2-y}F_y$, $Si_{1-x}Ge_xO_2$, $Si_{1-x}Ge_xO_{2-y}F_y$, $Si_{1-x-y}Ge_xP_yO_{02}$, $ZnP_2O_6$, $Si_{1-3x}Zn_xP_2xO_2$, $Ge_{1-3x}Zn_xP_2xO_2$, $TeO_x$, $Si_{1-x}Te_xO_{2+y}$, $Ge_{1-x}Te_xO_{2+y}$, $Si_{1-3x-y}Ge_yZn_xP_2xO_2$, $Si_{1-x}P_xO_{2-y}N_x$, Si—O—C, $Si_{1-2y}Al_xP_xO_4$, or $BeF_2$.

In some embodiments, the acoustic wave device is configured as a surface acoustic wave device.

In some embodiments, the acoustic wave device is configured as a bulk acoustic wave device.

In accordance with another aspect there is provided an acoustic wave device. The acoustic wave device comprises a piezoelectric material and a second material disposed on the piezoelectric material and having a temperature coefficient of frequency of a sign opposite a sign of a temperature coefficient of frequency of the piezoelectric material, the second material including one or more of $Si_{1-x-y}Ti_xP_yO_{2-z}F_z$ (x,y,z<0.1), $Si_{1-x-y}Ge_xP_yO_{2-z}F_z$, $Si_{1-x-y}B_xP_yO_{2-z}F_z$ (x=y<0.04), $Si_{1-3x}Zn_xP_2xO_{2-y}F_y$, $Si_{1-x}P_xO_{2-y}F_y$, $Si_{1-2y}Ga_xP_xO_4$, $Si_{1-2y}Ga_{y-x}B_xP_yO_4$, $Si_{1-2y}Ga_{y-x}B_xP_yO_{4-z}F_z$, or $TiNb_{10}O_{29}$.

In some embodiments, the acoustic wave device is configured as a surface acoustic wave device.

In some embodiments, the acoustic wave device is configured as a bulk acoustic wave device.

In some embodiments, the second material includes one or more of $Si_{1-x-y}Ti_xP_yO_{2-z}F_z$ (x,y,z<0.1), $Si_{1-x-y}Ge_xP_yO_{2-z}F_z$, or $Si_{1-x-y}B_xP_yO_{2-z}F_z$ (x=y<0.04).

In some embodiments, the second material includes one or more of $Si_{1-3x}Zn_xP_2xO_{2-y}F_y$, $Si_{1-x}P_xO_{2-y}F_y$, or $Si_{1-2y}Ga_xP_xO_4$.

In some embodiments, the second material includes one or more of $Si_{1-2y}Ga_{y-x}B_xP_yO_4$, $Si_{1-2y}Ga_{y-x}B_xP_yO_{4-z}F_z$, or $TiNb_{10}O_{29}$.

In accordance with another aspect there is provided an acoustic wave device. The acoustic wave device comprises a piezoelectric material and a second material disposed on the piezoelectric material and having a temperature coefficient of frequency of a sign opposite a sign of a temperature coefficient of frequency of the piezoelectric material, the second material including one or more of $Si_{1-x}Ti_xO_{2-y}F_y$, $Si_{1-x-y}Ti_xP_yO_2$, $Si_{1-x}B_xO_{2-y}F_y$, $Si_{1-x-y}B_xP_yO_2$, $GeO_2$, $GeO_{2-y}F_y$, $Si_{1-x}Ge_xO_2$, $Si_{1-x}Ge_xO_{2-y}F_y$, $Si_{1-x-y}Ge_xP_yO_2$, $ZnP_2O_6$, $Si_{1-3x}Zn_xP_{2x}O_2$, $Ge_{1-3x}Zn_xP_{2x}O_2$, $TeO_x$, $Si_{1-x}Te_xO_{2+y}$, $Ge_{1-x}Te_xO_{2+y}$, $Si_{1-3x-y}Ge_yZn_xP_{2x}O_2$, $Si_{1-x}P_xO_{2-x}N_x$, Si—O—C, $Si_{1-2y}Al_xP_xO_4$, or $BeF_2$.

In some embodiments, the acoustic wave device is configured as a surface acoustic wave device.

In some embodiments, the acoustic wave device is configured as a bulk acoustic wave device.

In some embodiments, the second material includes one or more of $Si_{1-x}Ti_xO_{2-y}F_y$, $Si_{1-x-y}Ti_xP_yO_2$, or $Si_{1-x}B_xO_{2-y}F_y$.

In some embodiments, the second material includes one or more of $Si_{1-x-y}B_xP_yO_2$, $GeO_2$, or $GeO_{2-y}F_y$.

In some embodiments, the second material includes one or more of $Si_{1-x}Ge_xO_2$, $Si_{1-x}Ge_xO_{2-y}F_y$, or $Si_{1-x-y}Ge_xP_yO_2$.

In some embodiments, the second material includes one or more of $ZnP_2O_6$, $Si_{1-3x}Zn_xP_{2x}O_2$, or $Ge_{1-3x}Zn_xP_{2x}O_2$.

In some embodiments, the second material includes one or more of $TeO_x$, $Si_{1-x}Te_xO_{2+y}$, or $Ge_{1-x}Te_xO_{2+y}$.

In some embodiments, the second material includes one or more of $Si_{1-3x-y}Ge_yZn_xP_{2x}O_2$, or $Si_{1-x}P_xO_{2-x}N_x$.

In some embodiments, the second material includes one or more of Si—O—C, $Si_{1-2y}Al_xP_xO_4$, or $BeF_2$.

DETAILED DESCRIPTION

Figure 1A:
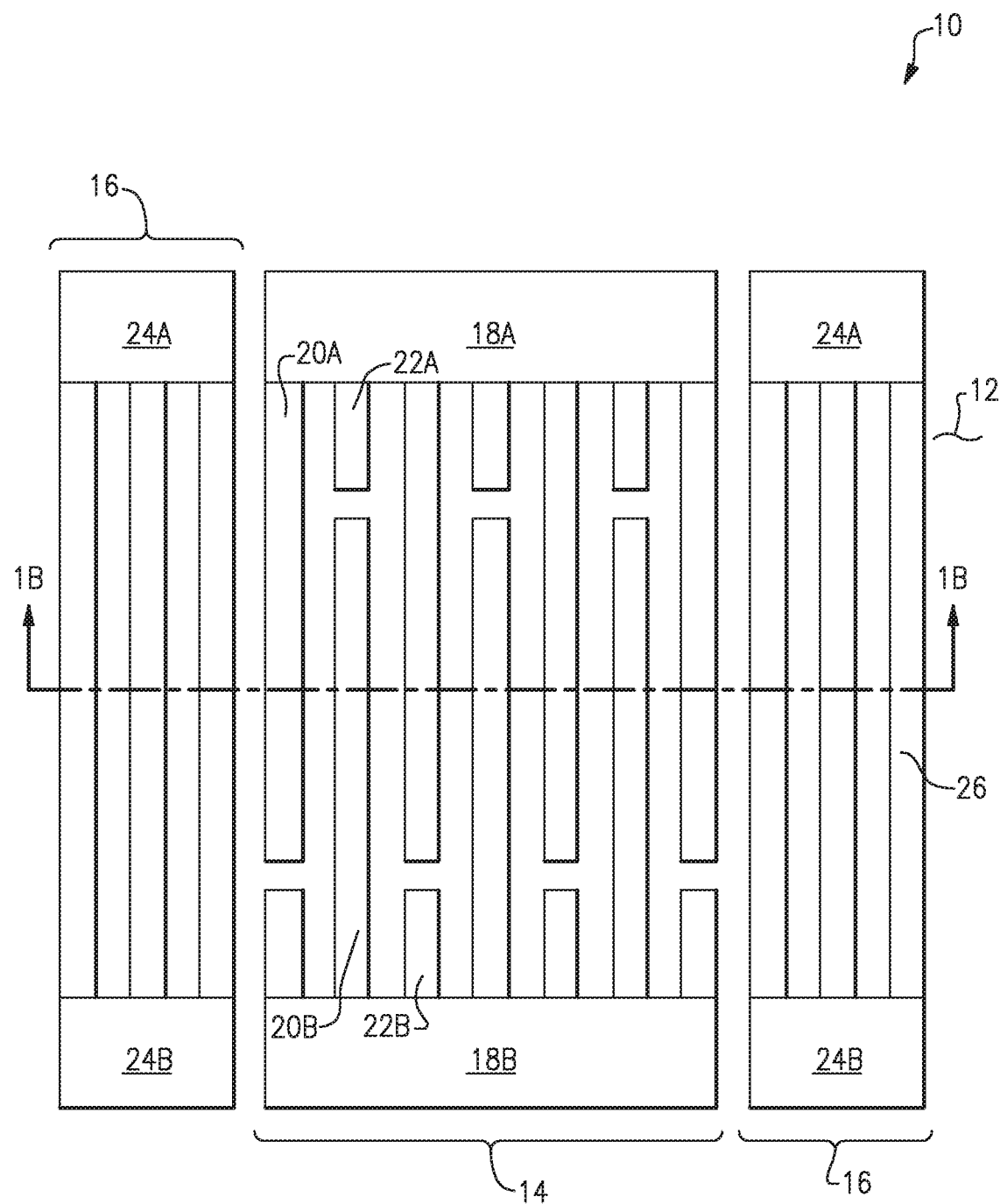
FIG. 1A is a plan view of an example of a surface acoustic wave resonator.
Figure 1B:
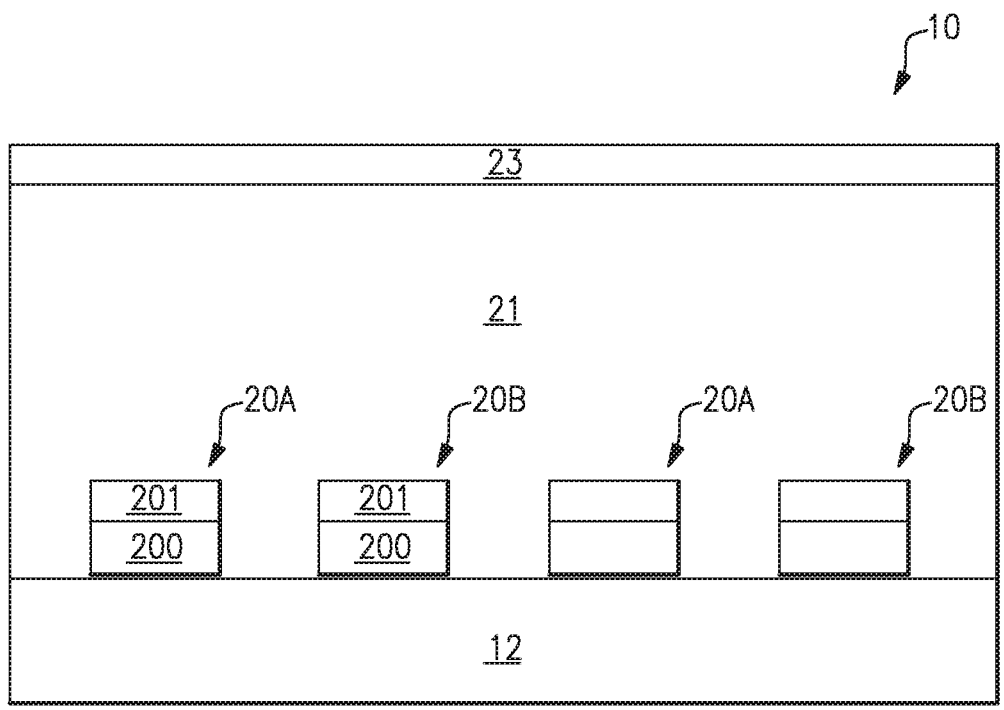
FIG. 1B is a cross sectional view of the surface acoustic wave resonator of FIG. 1A.
Figure 2:
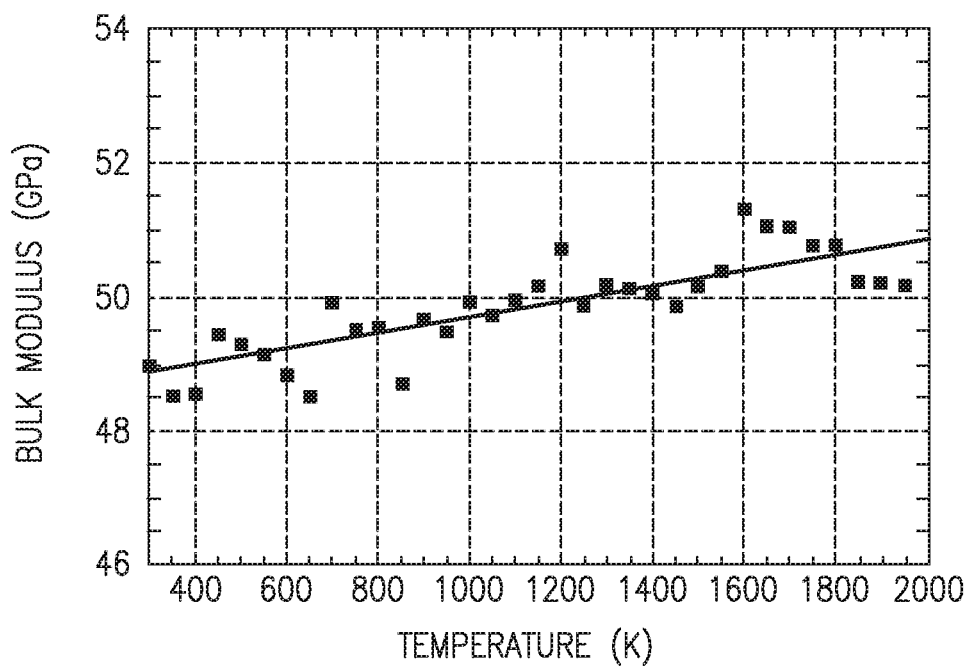
FIG. 2 is a chart of bulk modulus v. temperature for amorphous $SiO_2$.
Figure 3:
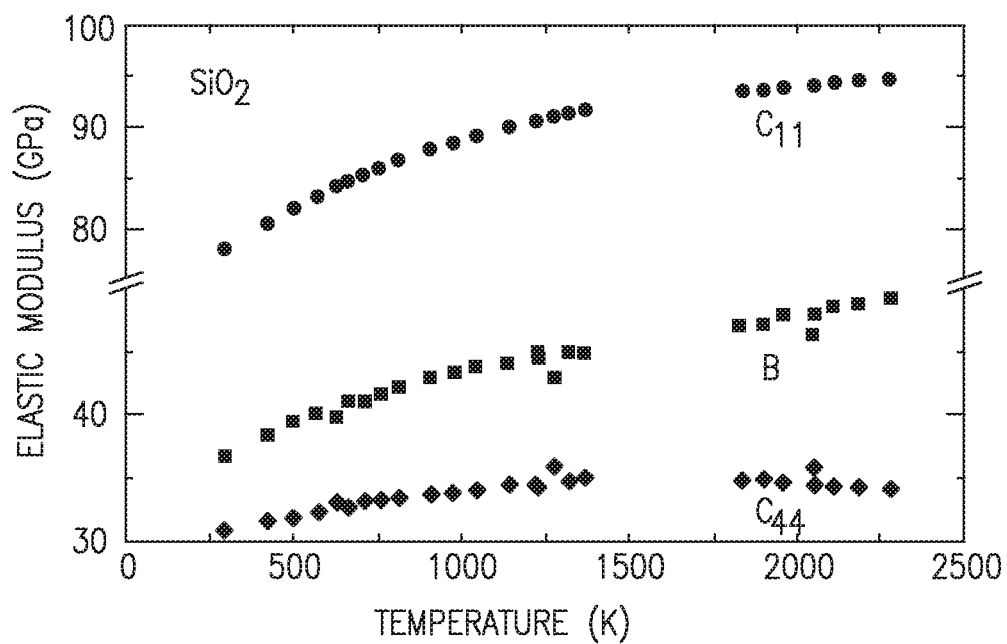
FIG. 3 is a chart of elastic modulus v. temperature for amorphous $SiO_2$.

Study of the materials science behind the use of amorphous silica ($SiO_2$) in temperature compensated acoustic resonator filters has provided insight into what drives acoustic losses in $SiO_2$ films and a path toward mitigating that loss as well as provided clues regarding materials other than $SiO_2$ which may serve as a similar function for temperate compensated surface acoustic wave (TC-SAW) and potentially bulk acoustic wave (BAW) resonators as well. By understanding the mechanisms for both the temperature coefficient of frequency (TCF) and loss in amorphous silica, other amorphous systems, including doped amorphous $SiO_2$, have been identified that may serve as an alternative to amorphous $SiO_2$ for use as temperature compensating materials in acoustic wave resonators. Disclosed herein are materials which may exhibit improvements in multiple properties or which are expected to exhibit enhancements for specific individual properties (e.g., TCF) for use as temperature compensating materials in acoustic wave resonators. Several of these materials are expected to exhibit a positive TCF to compensate for the negative TCF in the SAW piezoelectric material and/or exhibit lower acoustic loss overall than amorphous silica.

In one example, $Si_{1-x}Ge_xO_2$ material may exhibit interesting properties that may render it useful as a temperature compensating materials in an acoustic wave resonator. Si—Si, Ge—Ge and Si—Ge covalent bonding strength increases with increasing temperature, which is expected to make $Si_{1-x}Ge_xO_2$ a material with a positive thermal coefficient of elasticity (TCE) and a positive TCF. Ge is a larger ion than Si and may not show Ge—O bond angle variability, leading to lower losses than undoped $SiO_2$. $Si_{1-x}Ge_xO_2$ may thus exhibit lower losses than amorphous silica when used as temperature compensating material in acoustic wave resonators and may be useful where a minimal loss is a more important criteria than a high TCE.

In other examples, borophosphosilicate glass (BPSG) having a low wt. % of B and P or a blend of amorphous silica and commercially available BPSG or phosphosilicate glass (PSG) can be considered.

Materials with positive TCEs include $SiO_2$, $GeO_2$, $BeF_2$, $ZnP_2O_6$, possibly $TeO_2$ and mildly doped versions thereof. All have two anions to one cation ($AB_2$) and tetrahedral coordination (except $TeO_2$). All have low fill factors. Network modifiers may reduce the positive TCE in these types of material by contributing to high fill factors (low void space) and constraining polyamorphic transformations as described in more detail below. $Al^{3+}$ doping of these materials may inhibit positive TCE due to the preference of $Al^{3+}$ for 6 coordination. 6 co-ordinated metals are likely to prevent the poly-amorphic transformation associated with 4-coordinate (tetrahedral) cristobalite-like atomic arrangements. Borates and borosilicates have been reported to have negative TCEs. Conflicting data has been reported regarding association between the structures of these materials and thermal expansion. For example, $SiO_2$ shows near zero thermal expansion while $GeO_2$ and $BeF_2$ show large thermal expansion. Crystalline materials (for example, $Ti_2Nb_{10}O_{29}$) may show promise as well.

Solid solutions of positive TCE materials may be investigated and optimized for loss, for example, $Si_{1-x}Ge_xO_2$, $Si_{1-3x}Zn_xP_{2x}O_2$, $Si_{1-x}Te_xO_{2+y}$, $Ge_{1-3x}Zn_xP_2xO_2$, $Ge_{1-x}Te_xO_{2+y}$, or $Si_{1-3x-y}Ge_yZn_xP_{2x}O_2$. Fluorine doping appears to increase the TCE in amorphous silica. Removal of 3 membered Si—O rings in amorphous silica due to the presence of fluorine may aid β-Cristobalite type transitions, which may increase the TCE of the material for the reasons discussed below.

Drift of Resonant Frequency with Temperature in Acoustic Resonators

The TCF (Temperature Coefficient of Frequency) of a piezoelectric material is described by the relation:

$$TCF = TCV - \alpha \text{ where } TCV \text{ is the temperature coefficient of}$$
$$\text{velocity of an acoustic wave through the material and}$$
$$\alpha \text{ is the linear thermal expansion coefficient of the}$$
$$\text{material.}$$
$$= 1/v \, (\partial v / \partial T) - \alpha \text{ where } v \text{ is phase velocity}$$
$$v = (E/\rho)^{1/2} \text{ where } E \text{ is the elastic modulus and } \rho \text{ is the}$$
$$\text{density of the material.}$$

The TCF of a piezoelectric material is therefore dominated by the temperature coefficient of the elastic modulus (TCE).

With most materials, the elastic modulus decreases as temperature increases; the material loses stiffness or gets softer with increasing temperature. Amorphous silica is unusual in that, as the temperature increases, the elastic modulus increases and the stiffness of the material increases with increasing temperature. In acoustic wave devices in which amorphous silica is deposited on the piezoelectric material of the devices, deposition conditions of the amorphous silica have been reported to affect the TCF and loss of the acoustic wave devices.

Elastic modulus (Young's Modulus) in glasses such as amorphous silica depends on the strength of individual bonds (proportional to the glass transition temperature, $T_g$) and the atomic packing density ($C_g$, the volume of a material occupied by atoms rather than voids between atoms) of the material. Amorphous silica has a high bonding strength ($U_o$[Si—O]=800 kJ/mol) and an extremely low atomic packing density ($C_g$=0.45). More cross-linked materials tend to have higher Young's moduli (for example, E for Si—O—N and Si—O—C are both greater than the elastic modulus for $SiO_2$).

One theoretical model for the Young's modulus of amorphous materials may be expressed as:

$$E = 2C_g \Sigma (f_i \rho_i / M_i) \Delta H_{ia} \text{ where}$$

E is the elastic modulus
$C_g$ is the atomic packing density
$f_i$ is the molar fraction
$\rho_i$ is the oxide density
$M_i$ is the molar mass
$\Delta H_{ai}$ is the molar dissociation enthalpy Bonding strength for most amorphous materials decreases with temperature as the glass transition temperature ($T_g$) is approached and most glasses show a decrease in elastic modulus with temperature. $SiO_2$ is an exception.

Theories Regarding Positive TCE in Amorphous $SiO_2$—Thermal Transverse Phonon Vibrations Because of the large area of free volume (low atomic packing density), the amplitude of transverse vibration modes in amorphous $SiO_2$ increases with temperature. The transverse vibrations shorten the distance between adjacent Si atoms, reducing the free volume. Modifying ions like $Na^+$ reduce the free volume and the number of Si-bridging oxygen atoms, taking away the thermal effect. $Ti^{4+}$ prefers octahedral coordination but can go into tetrahedral crystal sites in small amounts. The presence of $Ti^{4+}$ in $SiO_2$ increases the Si—O—Si bond angle and enables transverse vibrations, increasing the TCE in amorphous $SiO_2$.

Correlation of TCE with Si—O—Si Bond Angle

FWHM (full-width at half maximum) of FT-IR (Fourier-transform infrared spectroscopy) shows close to a linear correlation (better than ω3 or ω4, which are FT-IR active modes associated with the bending or stretching of the Si—O—Si bond group) with TCE and fractional change of Si—O—Si bond angle with temperature. An increase in the observed FWHM corresponds to an increase in disorder and non-uniformity in the $SiO_2$ molecular structure. Elastic properties become non-uniform with increasing Si—O—Si bond angle in amorphous silica. ω3 decreases and ω4 increase with increasing Si—O—Si bond angle (θ=ideally 144°) in amorphous silica. The elastic stiffness of $SiO_2$ is related to θ which decreases with increasing temperature. A decrease in θ leads to a decrease in Si—Si bond distance which causes enhancement of the covalent Si—Si bond and an increase in $C_g$ and $\Delta H_{ai}$. Thermal energy increases the bonding force between Si atoms in amorphous silica and thus increases the elastic modulus of the material.

Theories Regarding Positive TCE in Amorphous $SiO_2$—Polyamorphism in $SiO_2$

The temperature dependence of the elastic modulus in $SiO_2$ may be due to the presence of two energetically distinct stable amorphous phases whose proportions vary with temperature and pressure. The scale of the transformation between these phases makes it difficult to observe experimentally. The temperature dependence of elastic modulus in amorphous $SiO_2$ does not appear to be related to nearest neighbor interactions. Rather, the distribution of Si—O ring sizes in amorphous $SiO_2$ appears to play a role in the temperature dependence of elastic modulus in amorphous $SiO_2$. Three-body molecular dynamics simulations have been performed. These simulations provide no evidence of change in co-ordination number upon transformation between the two phases and do not show that the thermal Si—O—Si angle decrease leads to reduction of Si—Si distance.

Figure 4:
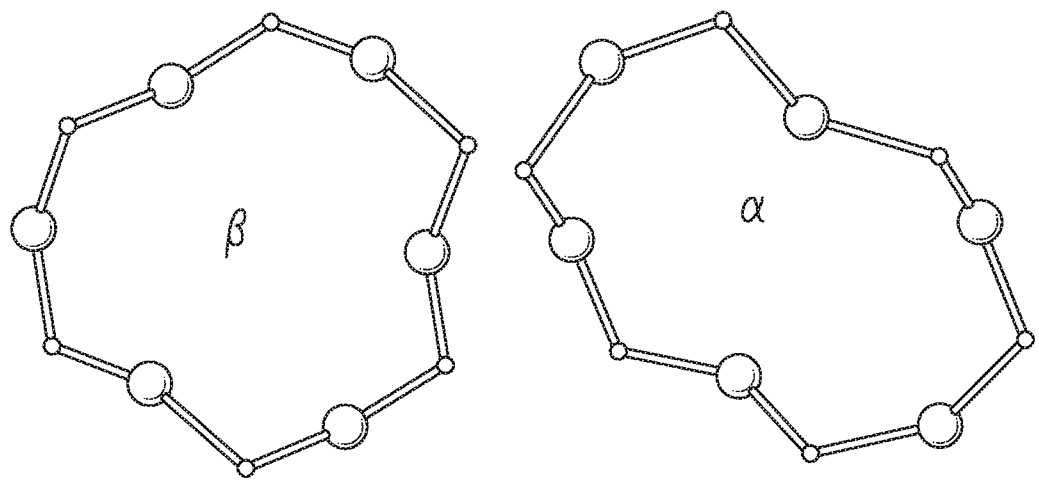
FIG. 4 illustrates two different ring arrangements of atoms in amorphous $SiO_2$.

Amorphous $SiO_2$ exhibits a localized reversible structural transformation similar to cristobalite. An α form with puckered rings converts to a β form with symmetric rings. (See FIG. 4.) The chemical bonds of the α form can pivot and rotate without breaking. Deformation of the β form occurs by bond compression only (no pivoting). Slow thermal conversion of α rings to β rings is believed to be at least partially responsible for the positive TCE observed in amorphous $SiO_2$. The conversion of α rings to β rings is difficult to measure experimentally. There is no change in bond length, bond angle, coordination number, or ring size. Other glasses with a low atomic packing density may exhibit similar thermal conversion of α rings to β rings.

Measurement of TCE in Amorphous Silica

The TCF of a SAW device is typically improved by depositing a thin layer of amorphous silica in the stack of material above the piezoelectric substrate of the device. The TCE of the amorphous $SiO_2$ is strongly correlated with location of the FT-IR FWHM ω4 (the rocking mode for the Si—O—Si bond which is FT-IR active) peak. FT-IR may be a useful test for measuring the TCE in materials such as amorphous silica. Other tests such as UV reflectance may detect Rayleigh scattering which may be indicative of defects in such materials that may lead to reduction in quality factor (Q value):

TABLE 1

| Feature | Material Property | Test | Structural Cause |
|---|---|---|---|
| Positive TCE | Positive Temperature Coefficient of Elasticity | FT-IR | Distribution of Si—O—Si bond angles. Possible association with polyamorphism |
| Q Value | Acoustic attenuation | Vis.-UV (Rayleigh Scattering) | Micro-porosity, chemical disorder, 3-4 member rings |

EXPERIMENTAL EXAMPLES

Fluorine Doped Amorphous Silica:

It has been reported that fluorine doped amorphous silica has higher ω4 than undoped amorphous silica. The presence of fluorine in amorphous silica has a strong effect on the Si—O—Si bond angle. Fluorine doped $SiO_2$ shows a larger positive TCE and TCF than undoped amorphous silica. The electromechanical coupling factor between amorphous silica and a piezoelectric material upon which it is deposited decreases with increased fluorine doping of the silica. Si—

O—Si stretching FTIR band position shifts to higher wave numbers as fluorine concentration goes from 0-12 at % F. This positional shift is associated with a change in frequency of the FT-IR active mode. This is speculated to be associated with increased polarization of the Si—F bonds and the modification of the Si—O—Si bonding structure near the F dopants, possibly favoring the polyamorphic transition. Si—F bonds are polarized and modify the Si—O—Si bonding structure near F dopants. This is a possible reason for the enhancement in TCE in fluorine doped amorphous silica.

Titania Doped Amorphous Silica:

Up to 10 mole % $TiO_2$ in amorphous silica increases the TCE of the titania doped amorphous $SiO_2$. Elastic coefficients and therefore sound velocities decrease with increasing $TiO_2$ concentration in amorphous silica. $Ti^{4+}$ prefers octahedral coordination but can go into tetrahedral crystal sites in $SiO_2$ in small amounts. The presence of the titania increases the Si—O—Si bond angle, enabling transverse vibrations and increasing the TCE of the material. The titania may pair up with F additions which annihilate 3 member Si—O rings in amorphous silica, further increasing the TCE of the doped material.

Boron Doped Amorphous Silica (In FBAR):

Boron doped amorphous silica exhibits higher TCE values than undoped amorphous silica. It is estimated that an optimum B content in boron-doped amorphous silica may be about 1.85 weight %. Boron doping of silica involves direct substitution of B for Si atoms. B—O—Si peaks are observed in FTIR spectra of boron doped silica. The coupling factor between amorphous silica and a piezoelectric material upon which it is deposited is relatively unaffected when silica is doped with B. Reports indicate that boron doped amorphous silica may exhibit elastic losses that are too high for practical FBAR devices, although the effect on TC-SAW devices is uncertain.

Comparison of Amorphous $SiO_2$ and Amorphous $GeO_2$:

$GeO_2$ also shows a positive TCE from $-120°$ C. to $+140°$ C. The magnitude of the TCE in $GeO_2$ is not as great as that in amorphous $SiO_2$. $GeO_2$ exhibits an unusual drop in elastic modulus below $-120°$ C. $GeO_2$ exhibits no anomalous behavior in thermal expansion behavior (unlike amorphous $SiO_2$).

$TeO_x$ Based Glasses:

$TeO_x$ based glasses show a negative TCD. (TCD=$\alpha$–TCV. TCD is the Temperature Coefficient of Delay and is a device related parameter.) $TeO_x$ based glasses may exhibit much higher dielectric constants than amorphous silica. (18 for $TeO_2$ to 27 for $TeO_3$.) Very negative values of TCD may be achieved with oxidized $TeO_2$ (more likely $TeO_3$) or an admixture thereof. The density of $TeO_x$ based glasses decreases with oxygen content (5.11 g/cc for $TeO_2$ and 4.58 g/cc for $TeO_3$). The elastic moduli ($C_{11}$ and $C_{44}$) of $TeO_x$ decreases with x while TCE increase with x.

A thinner layer of $TeO_x$ than $SiO_2$ may exhibit comparable compensation for the TCF of the piezoelectric substrate in an acoustic wave device. A thinner layer of $TeO_x$ may exhibit a smaller decrease in SAW velocity relative to a layer of $SiO_2$ in an acoustic wave device. The coupling coefficient $k^2$ between $TeO_x$ and piezoelectric substrates is greatest for x=1 (TeO). Te is toxic, which may be an impediment to its use in practical devices.

There is a lone electron pair on $Te^{4+}$ which leads to asymmetrical coordination of $TeO_x$ glasses. Vitreous $TeO_x$ is arranged in $TeO_4$ trigonal bi-pyramids with 2 axial and 2 equatorial Te—O bonds. Corner sharing between Te and O may lead to a variation in the $Te_{ax}$—O—Te bond angle. Some oxygen in $Te^{6+}$ sites in $TeO_x$ increases the number of Te-bridging oxygens leading to anomalous elastic behavior. $Te^{4+}$—$W^{6+}$—O glasses provide a model structure for mixed $Te^{4+}/Te^{6+}$ based glasses. Both $W^{6+}$ and $Te^{6+}$ are expected to be 6-coordinate.

There are conflicting reports regarding the TCE of tellurium based glasses. One study reports that the TCE for $TeO_2$ glass and $Te^{4+}$—$W^{6+}$—O is negative. It is possible that reversible changes in the $Te^{4+}/Te^{6+}$ ratio occur on heating and that these changes may be relevant to the observed TCE. TCD is not a direct measurement of TCE. The anomaly in TCD for $TeO_x$ may have to do with the thermal expansion coefficient of the material.

Figure 5:
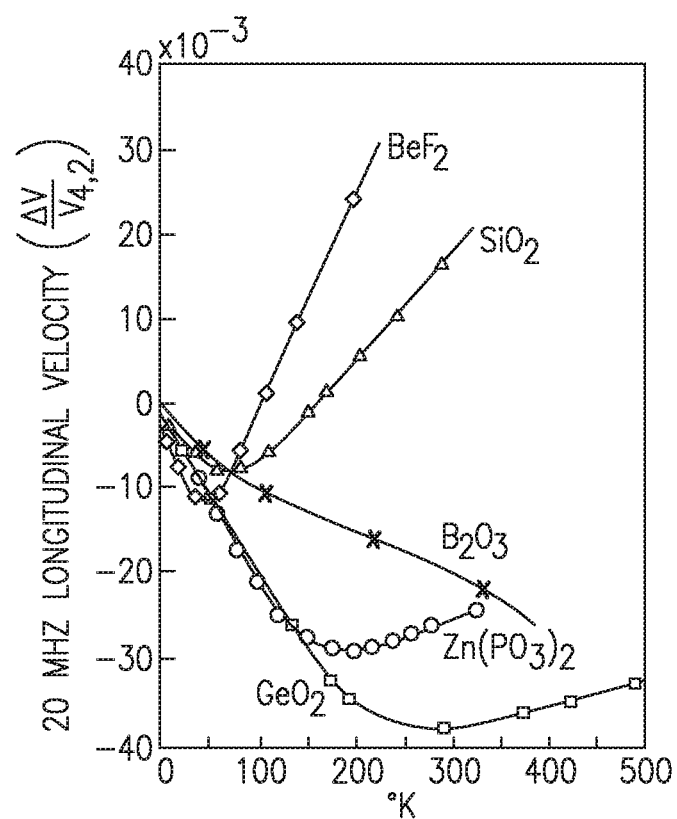
FIG. 5 is a chart of fractional velocity v. temperature for a number of simple glasses.
Figure 6:
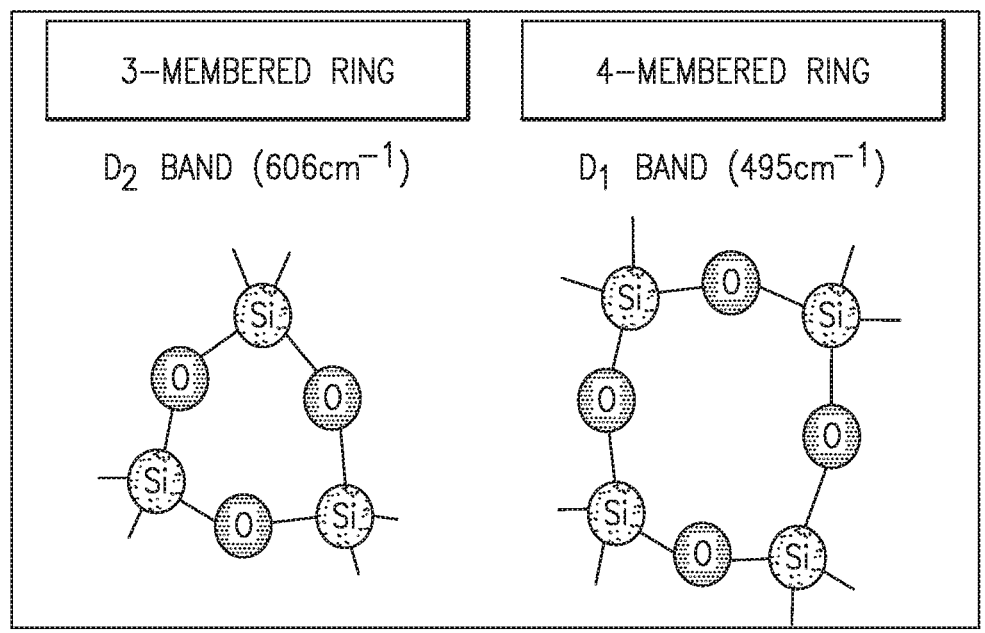
FIG. 6 illustrates a 3 membered ring and a 4 membered ring including strained bonds in silica.
Figure 7:
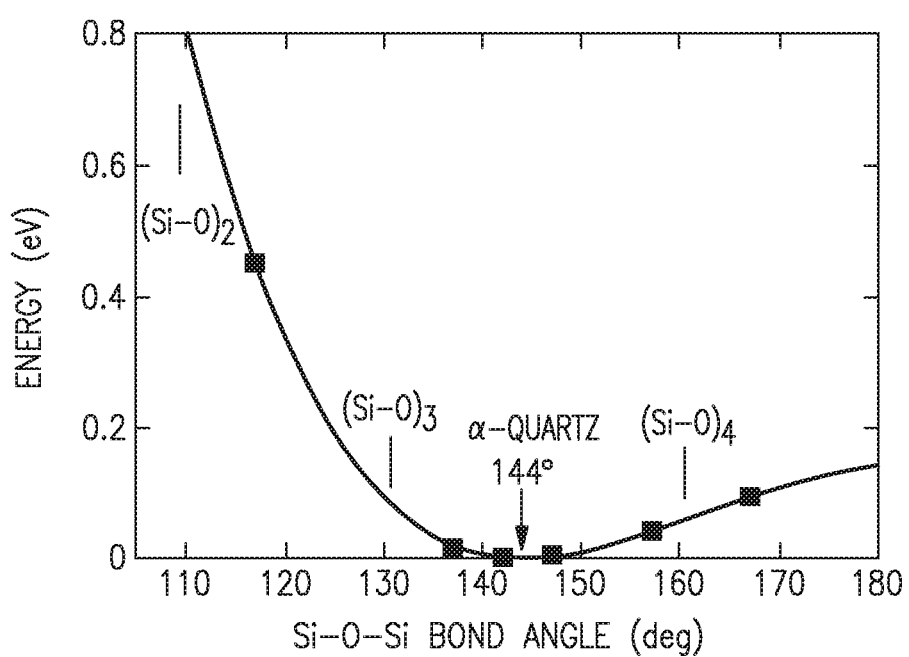
FIG. 7 is a chart of energy v. Si—O—Si bond angle in silica.
Figure 8:
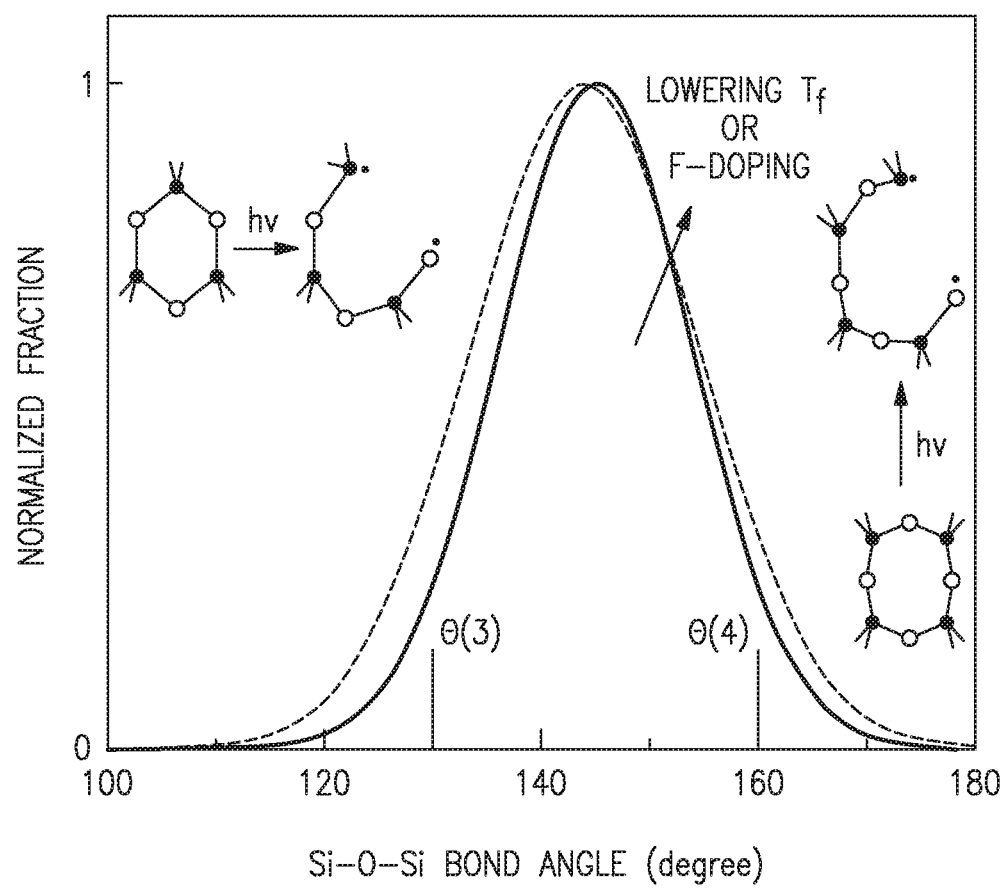
FIG. 8 illustrates a typical distribution of Si—O—Si bond angles in silica.

Other Amorphous Materials with positive TCE:

$BeF_2$ and $Zn(PO_3)_2$ show positive TCE values near room temperature as well. These glasses exhibit low temperature acoustic absorption characteristics. $BeF_2$ may not be feasible for use in practical devices due to Be toxicity but $Zn(PO_3)_2$ glass shows both Zn and P in edge sharing tetrahedra. FIG. 5 is a chart of fractional velocity v. temperature for a number of simple glasses.

In $ZnP_2O_6$ or $Zn(PO_3)_2$ glass property discontinuities are associated with changes in coordination number of $Zn^{2+}$. Around 50 mole % Zn, the coordination changes from 6 to 4 in $xZnO$-$(1-x)P_2O_5$. This is near the $ZnP_2O_6$ composition. The packing density is lowest at the $ZnP_2O_6$ composition. $Zn(PO_3)_2$ glass exhibits poor chemical durability vs. amorphous silica but in use, may be covered with a more chemically durable layer, such as silicon nitride. Changes in Zn co-ordination number with temperature along with low packing densities may account for the positive TCE of zinc phosphate glass. No systematic studies of the elastic properties of zinc phosphate glass are known.

Cristobalite Structured Materials:

Cristobalite ring transitions are a likely explanation for the positive TCE observed in amorphous silica. Therefore, other materials that crystalize in the cristobalite or cristobalite derivative structures may also exhibit a positive TCE. $GeO_2$ shows a positive TCE. $BeF_2$ shows a positive TCE and crystallizes in the cristobalite structure, however, $BeF_2$ is toxic. Other cristobalite derivative structures include α-Cristobalite structures such found in as $AlPO_4$, $MnPO_4$, $AlAsO_4$, and $GaAsO_4$ and β-Cristobalite structures such as found in $BPO_4$, $BeSO_4$, and $GaPO_4$.

Beryllium Fluoride ($BeF_2$) Glass:

$BeF_2$ glass shows a higher TCE and acoustic velocity than amorphous silica. $BeF_2$ glass has a cristobalite structure and melts at 554° C. It is an extremely toxic material. The mass ratio for $BeF_2$ is different than that of $SiO_2$ or $GeO_2$. In $BeF_2$ the anion is heavier. A low temperature negative thermal expansion region of $BeF_2$ has been reported. $BeF_2$ is very sensitive to water attack. Rayleigh scattering in $BeF_2$ is similar to that in fluoride based optical glasses.

Amorphous $AlPO_4$ and $GaPO_4$:

In $AlPO_4$ Al in tetrahedral coordination removes P=O (double bond between oxygen and phosphorus-creates a non-bridging oxygen ion). As Al content goes up, more 6 coordinate Al appears and more (P=O) bonds appear as well. P=O bonds may be good for reducing loss in P doped amorphous silica but may not contribute to a positive TCE. One study reported amorphous $AlPO_4$ in thin films with Al in both octahedral and tetrahedral co-ordination. Amorphous $AlPO_4$ may be more similar to tridymite than cristobalite $SiO_2$. The fill factor of amorphous $AlPO_4$ is likely too high to exhibit a positive TCE.

In $GaPO_4$ $Ga_{3+}$ with a $d^{10}$ configuration is less likely to go into octahedral coordination than $Al^{3+}$. One study reported amorphous $GaPO_4$ in thin films with Ga in both octahedral and tetrahedral co-ordination. There were two types of chains; [O—Ga—O—P]$_n$ based on cristobalite and [O—Ga—O—Ga]$_n$ based on the structure of amorphous Ga$_2$O$_3$. GaPO$_4$ may be more interesting than AlPO$_4$ due to its cristobalite motif although the fill factor may be too high for the material to exhibit a positive TCE. The structure and Ga coordination of GaPO$_4$ is sensitive to the Ga/P ratio and oxygen content.

Ga$_{1-x}$B$_x$PO$_4$ may also be of interest. The relative amounts of Ga and B may be adjusted to have an average ionic size roughly equivalent to that of Al$^{3+}$ with less tendency for octahedral coordination. Ga$_{1-x}$B$_x$PO$_4$ may have reduced atomic packing density (C$_g$) relative to GaPO$_4$.

BPO$_4$ and BPSG

BPO$_4$ shows a cristobalite structure. A low B content in BPO$_4$ may improve the TCE of the material, but these materials have high viscoelastic losses. The addition of P may reduce the viscoelastic losses in BPO$_4$. The combination of amorphous silica and BPO$_4$ (BPSG) may have interesting properties. Commercial BPSG glass compositions include B and P in the range of 0-12 wt. % B and P. This is likely too much B and P for the material to exhibit a positive TCE. High B and P BPSG is a low temperature softening glass that renders it useful as a material that that may rendered highly planar in semiconductor device fabrication. Commercially available BPSG likely has a negative TCE.

Crystalline Materials

Negative thermal expansion ceramics may be interesting. The viscoelastic losses of these types of materials have not previously been evaluated. These materials tend to show density fluctuations with microstructural features being possible contributors. These materials may exhibit a large free volume (low packing factor). There is experimental evidence of positive TCE in Ti$_2$Nb$_{10}$O$_{29}$. Studies have focused on bulk materials with little information available regarding the properties of deposited films of these materials.

Theory of Elastic Losses in Amorphous Materials:
Theory of Loss in Piezoelectric Materials:
Loss in a Piezoelectrically Vibrating Plate may Come from 4 Sources:
1) DC Conductivity (σ)—Unlikely to play a role with insulating materials;
2) Dielectric Loss (ε")—Standard tan δ as in ε"/ε';
3) Acoustic Viscosity (η)—Viscoelastic behavior η=c$^P_{11}$"/c$^P_{11}$' where c$^P_{11}$ is the contour stiffness coefficient; and
4) Piezoelectric Loss (e")—Conversion losses between mechanical input and electrical output or electrical input and mechanical output.

Viscoelastic losses are expected to dominate loss behavior in TC-SAW materials.

Causes of Loss in Thin-Film Bulk Acoustic Resonator (FBAR) Materials may Include the Following:
  Acoustic Attenuation (a form of viscoelastic loss)
  Ohmic Loss (FBAR materials are typically conductive species, so Ohmic losses are expected to be relatively minor)
  Interface Acoustic Loss (Due to low elastic modulus material in contact with the FBAR material)
  Anchor Loss (Loss associated with the need to attach or "anchor" the resonator to a non-piezoelectric substrate)
  Acoustic Radiative Loss (another form of viscoelastic losses)

For BAW or FBAR applications, materials with a high modulus and therefore a high acoustic velocity in addition to positive TCE and low loss may be desirable.

Viscoelastic Loss in Amorphous Silica:

Acoustic losses in amorphous silica are sensitive to preparation technique. The FWHM of the FT-IR spectra in amorphous silica is closely related to TCF and propagation loss. Acoustic losses due to quality factor (Q) degradation may be due to the presence of hydroxyl impurities or SiO$_2$ network distortion. Rayleigh scattering indicates loss due to defects such as microporosity or chemical disorder. UV reflectance may be the best test for Rayleigh scattering and thus defects such as microporosity or chemical disorder in a sample of amorphous silica.

Physical Disorder and Optical Properties of Amorphous SiO$_2$:

There are two types of structural disorder in amorphous SiO$_2$:
  Chemical Disorder: Point defect such as vacancies, interstitials, over- or under-coordinated Si or O
  Physical Disorder: Wide distribution of Si—O—Si bond angles, size of (Si—O)$_n$ ring structure (n=5-7)

Three and four membered rings indicate strained Si—O bonds. Stable 6-7 member rings show a bond angle of 145°; strained three member rings show a bond angle of 130.5° and strained four member rings show a bond angle 160.5°. Strained bonds are unpaired electron defect precursors. Fictive temperature (T$_f$) is a value representing degree of physical disorder. Fluorine doping reduces the number of three and four membered ring structures in amorphous silica. The different analytical techniques shown in Table 2 below may detect the indicated structural and chemical disorders.

TABLE 2

| Structural Disorder | Analytical Technique | Effect |
|---|---|---|
| Chemical | Optical Absorption | Si—Si bonds show 7.6 eV absorption |
|  |  | SiOH groups show 7.4 eV absorption |
| Physical | VUV Transparency | VUV absorption edge shifts to longer wavelengths with more strained Si—O—Si bonds. |
|  | Raman Spectroscopy | Raman bands at 495 cm$^{-1}$ for 4 member rings and 606 cm$^{-1}$ for 3 member rings. |
|  | F$_2$ Excimer Laser | * |
|  |  | ** |

TABLE 2-continued

| Structural Disorder | Analytical Technique | Effect |
|---|---|---|
| * | ≡Si—O—Si≡ (strained) | $\xrightarrow{h\nu\,(7.9\,eV)}$ ≡Si• + •O—Si≡. |
| ** | ≡Si—O—Si≡ (unstrained) | $\xrightarrow{\text{band-to-band excitation}}$ ≡Si—Si≡ + $O_{int}$ (POR and $O_2$) |

Elimination of Strained Bonds in Amorphous Silica:

There are two known methods of eliminating strained Si—O—Si bonds in amorphous silica:
 Low Temperature Annealing
 F doping Fictive temperature is the equilibrium temperature for a particular glass defect concentration. Lower fictive temperatures are indicative of fewer physical defects. Annealing and F doping effectively lowers the fictive temperature of amorphous silica.

Rayleigh Scattering and Fictive Temperature:

Rayleigh scattering can be reduced by lowering the fictive temperatures ($T_f$) and therefore, reducing the number of physical defects in an amorphous glass. Experiments with Rayleigh scattering of annealed and reheated $GeO_2$ glass and $SiO_2$:F glass confirm this.

$T_f$ is related to the optical absorption band peak ($v_2$) of a material. In pure $SiO_2$ $T_f$ is related to the optical absorption band peak by $T_f = 43809.21/v_2 - 2228.61$.

Rayleigh scattering in amorphous glasses may be broken into two major components:

$$A = A_d + A_c$$

A is the total Rayleigh scattering coefficient,
$A_d$ is the Rayleigh scattering due to density fluctuations
$A_c$ is the Rayleigh scattering due to concentration fluctuations.

$$A_d = 8/3\,\pi^3 n^8 p^2 k \beta_T T_f$$

n is the refractive index
p is the photoelastic coefficient
k is Boltzmann's constant
$\beta_T$ is the isothermal compressibility at $T_f$ The addition of dopants to an amorphous glass material increases $A_c$ but if the doping lowers $T_f$ (like F doping) there may be an overall benefit with regard to the reduction in strained bonds. Thermal treatments do not increase $A_c$.

Elastic Loss in Fluorine Doped Amorphous Silica:

There are mixed reports on the effect of F doping on Q in amorphous silica. There is little variation in the Q factor for F content less than 8.8 atomic percent. Most dopants in $SiO_2$ dramatically increase acoustic loss. Fluorine displaces $OH^-$ in amorphous silica. At 7.6% F, the $OH^-$ FTIR absorption band disappears. Fluorine reacts with the strained Si—O—Si bonds preferentially. At low concentrations of F dopant in amorphous silica $Si(O_3)F$ FTIR peaks are observed. At higher concentrations $Si(O_2)F_2$ peaks appear. At 8 atomic % F, the Raman peaks for the threefold (peak 1) and fourfold rings (peak 2) decrease dramatically. $F^-$ reacts similar to $H_2O$ in amorphous silica.

Low Rayleigh Scattering Amorphous Silica (P and F):

Rayleigh scattering is an issue in the photonics industry for optical transmission systems.

Rayleigh scattering results from dielectric constant variations due to density fluctuations and is indicative of elastic loss in amorphous silica.

Materials used to reduce Rayleigh scattering in optical amorphous silica may also be useful for reducing the elastic loss in amorphous silica. Phosphorus (8.5 wt. %) in combination with fluorine (0.3 wt. %) lowers the fictive temperature of amorphous silica but has an unknown effect on TCE.

P may act similar to F in terms of breaking up structure by creating non-bridging anions due to double bond with oxygen:
 Si—F
 P=O Impurity Driven Losses:

Metals and $OH^-$ groups are common impurities in amorphous silica. The relative amounts of these types of impurities is dependent upon the source and method of formation of the amorphous silica.

Amorphous silica may be classified into various types based on the method of formation of the amorphous silica:
 Type I amorphous silica is created by the electric melting of natural quartz in a vacuum, or in an inert gas at low pressure in crucibles. Type I amorphous silica typically includes metallic impurities, for example, Al or Na, but less than 5 ppm $OH^-$
 Type II amorphous silica is created by crucible-free $H_2$—$O_2$ flame fusion. Type II amorphous silica typically has a lower concentration of metallic impurities than Type I amorphous silica. Type II amorphous silica typically has an $OH^-$ concentration around 100 ppm.

Amorphous silica may also be created synthetically from non-silica precursors. Types of synthetic amorphous silica include:
 Type III amorphous silica is directly deposited by $H_2$—$O_2$ hydrolysis. Type III amorphous silica typically has a high (1000 ppm) $OH^-$ concentration.
 Type IIIa, b amorphous silica is prepared by "soot" remelting. Type IIIa, b amorphous silica is suitable for dehydration and doping.
 Type IV amorphous silica is prepared by an $O_2$—Ar plasma CVD method. Type IV amorphous silica is nearly $OH^-$ free but contains $O_2$ molecules.

Interstitial Molecules

Due to the low packing fraction of amorphous $SiO_2$, molecules such as $H_2$, $O_2$, or $O_3$ may exist in "interstices" and may contribute to impurity driven losses.

Ultra-High Elastic Modulus Glasses

Ultra-high elastic modulus glasses enable high sound velocities for reduced interface losses for temperature compensated BAW or FBAR implementations. Examples of ultra-high elastic modulus glasses include $SiO_xC_{1-x}$ and SiON.

Additional cross-linking and high anion coordination as compared to amorphous silica increases the Young's modulus of ultra-high elastic modulus glasses relative to amorphous silica. There is a limitation on the level of substitution of impurities such as C or N into amorphous $SiO_2$ before phase separation occurs. It is unclear how much C or N could be doped in $SiO_2$ such that the material retains a positive TCE.

To obtain high modulus materials one may desire the following:

Multiple glass formers
Modifying cations of different sizes
Multiple anions

The highest reported Young's modulus in an inorganic non-metallic glass is 183 GPa in $Y_{0.146}Si_{0.232}Al_{0.034}O_{0.31}N_{0.29}$.

The study of the properties of the materials disclosed above raises a material design challenge: The same structural features which allow for the negative TCE (low $C_g$—atomic packing density) also contribute to the density fluctuations leading to Rayleigh scattering. In some examples it may be possible to achieve lower elastic losses by lowering the fictive temperature by annealing. Coupled additives or materials with positive TCE and one or more additives to reduce loss may be attractive for use as temperature compensating materials in acoustic wave resonators. The addition of F as a dopant likely facilitates cristobalite-like transitions in various material systems by bonding to strained bonds which serve as impediments to such transitions. F also removes strained bonds which serve as "Rayleigh scatterers." It is unknown if phosphorus can do the same.

A listing of different materials that may exhibit desirable properties for use as temperature compensating materials in acoustic wave resonators and the expected effect of the dopant(s) on the base material and comments regarding the materials is presented in Table 3 below:

TABLE 3

| Additive | Expected Effect | Comments |
|---|---|---|
| Crystalline Negative Thermal Expansion Materials ($TiNb_{10}O_{29}$) | Low packing factor leads to possibility of positive TCE (observed in $TiNb_{10}O_{29}$). | Exhibits Rayleigh scattering low due to crystalline nature. No known information about film deposition. |
| $Si_{1-x}Ti_xO_{2-y}F_y$ | Ti increases Si—O—Si bond angle and increases TCE. Bond angle increase reduces chances of high loss three membered rings. Ti may couple with F which preferentially attacks three and four member rings. May get both high TCE and low loss. | $TiO_2$ has been shown to improve TCE. F shown to improve TCE and have no effect on loss. |
| $Si_{1-x-y}Ti_xP_yO_2$ | Ti increases Si—O—Si bond angle and increases TCE. Bond angle increase reduces chances of high loss three membered rings. Ti may couple with F which preferentially attacks three and four member rings. May get both high TCE and low loss. | One reference shows $TiO_2$ improves TCE. Improved loss due to P hypothesized. |
| $Si_{1-x-y}Ti_xP_yO_{2-z}F_z$ | Ti increases Si—O—Si bond angle and increases TCE. Bond angle increase reduces chances of high loss three membered rings. Ti may couple with F which preferentially attacks three and four member rings. May get both high TCE and low loss. | One reference shows $TiO_2$ improves TCE. F shown to improve TCE and have no effect on loss. Reduced loss from F and P doping hypothesized. |
| $Si_{1-x}B_xO_{2-y}F_y$ | B (<2 wt. %) reported to improve TCE but increases loss. F doping may counteract the increased loss. | Mechanism for increase in TCE and loss with B doping unknown. |
| $Si_{1-x-y}B_xP_yO_2$ (BPSG) | B (<2 wt. %) reported to improve TCE but increases loss. P doping may counteract the increased loss. | This is BPSG glass. Interesting materials likely at lower B and P levels than commercial BPSG. |
| $Si_{1-x-y}B_xP_yO_{2-z}F_z$ | B (<2 wt. %) reported to improve TCE but increases loss. Combined P doping may counteract the increased loss. | This is a fluorinated version of a dilute BPSG glass. |
| $GeO_2$ | Amorphous $GeO_2$ has a positive TCE but lower magnitude than $SiO_2$. Larger ion means less flexibility of bond angle and likely lower viscoelastic losses. | $GeO_2$ is expensive. |
| $GeO_{2-y}F_y$ | Amorphous $GeO_2$ has a positive TCE but lower TCE than $SiO_2$. Larger ion means less flexibility of bond angle and likely lower viscoelastic losses. Fluorine enhances TCE, counteracting expected effect of Ge. Removing strained bonds may enhance this low loss behavior. | $GeO_2$ is expensive. Uncertain the level of $GeO_2$ required to trade TCE for loss. F increasing TCE may reduce amount of $GeO_2$ required. |

TABLE 3-continued

| Additive | Expected Effect | Comments |
| --- | --- | --- |
| $Si_{1-x}Ge_xO_2$ | Amorphous $GeO_2$ has a positive TCE but lower TCE than $SiO_2$. Larger ion means less flexibility of bond angle and likely lower viscoelastic losses. | $GeO_2$ is expensive. Uncertain the level of $GeO_2$ required to trade TCE for loss. |
| $Si_{1-x}Ge_xO_{2-y}F_y$ | Amorphous $GeO_2$ has a positive TCE but lower TCE than $SiO_2$. Larger ion means less flexibility of bond angle and likely lower viscoelastic losses. Fluorine enhances TCE counteracting expected effect of Ge. Removing strained bonds may enhance this low loss behavior. | $GeO_2$ is expensive. Uncertain the level of $GeO_2$ required to trade TCE for loss. F increasing TCE may reduce amount of $GeO_2$ required. |
| $Si_{1-x-y}Ge_xP_yO_2$ | Amorphous $GeO_2$ has a positive TCE but lower TCE than $SiO_2$. Larger ion means less flexibility of bond angle and likely lower viscoelastic losses. F is a better bet due to potential enhanced TCE. | $GeO_2$ is expensive. Uncertain the level of $GeO_2$ required to trade TCE for loss. Improved loss due to P doping is hypothesized. |
| $Si_{1-x-y}Ge_xP_yO_{2-z}F_z$ | Amorphous $GeO_2$ has a positive TCE but lower TCE than $SiO_2$. Larger ion means less flexibility of bond angle and likely lower viscoelastic losses. Fluorine enhances TCE counteracting expected effect of Ge. Removing strained bonds may enhance this low loss behavior. | $GeO_2$ is expensive. Uncertain the level of $GeO_2$ required to trade TCE for loss. F increasing TCE may reduce amount of $GeO_2$ required. Improved loss due to P hypothesized. |
| $ZnP_2O_6$ | Positive TCE reported. P behaves like F in creating P=O non-bridging oxygens. | Interesting. Reports of positive TCE. |
| $Si_{1-3x}Zn_xP_{2x}O_2$ | Positive TCE reported. P behaves like F in creating P=O non-bridging oxygens. | Interesting. Very little information. Reports of positive TCE in $ZnP_2O_6$. |
| $Si_{1-3x}Zn_xP_{2x}O_{2-y}F_y$ | Positive TCE reported. P behaves like F in creating P=O non-bridging oxygens. F added to enhance TCE and reduce Rayleigh scattering. | Interesting. Very little information. Reports of positive TCE in $ZnP_2O_6$. |
| $Ge_{1-3x}Zn_xP_{2x}O_2$ | Amorphous $GeO_2$ has a positive TCE but lower magnitude than $SiO_2$. Larger ion means less flexibility of bond angle and likely lower viscoelastic losses. Positive TCE reported for $ZnP_2O_6$. P behaves like F in creating P=O non-bridging oxygens. | $GeO_2$ is expensive. Uncertain the level of $GeO_2$ required to trade TCE for loss. Very little information about $ZnP_2O_6$. |
| $TeO_x$ | Densification and stiffening may be associated with $Te^{4+}$-$Te^{6+}$ transition near room temperature. Only one source reports TCD which may not be directly related to TCE. May be a thermal expansion anomaly. Other sources report negative TCE. | Tellurium is toxic Tellurium is expensive. |
| $Si_{1-x}Te_xO_{2+y}$ | Densification and stiffening may be associated with $Te^{4+}$-$Te^{6+}$ transition near room temperature. Only one source reports TCD which may not be directly related to TCE. May be a thermal expansion anomaly. Other sources report negative TCE. Diluting in $SiO_2$ may be instructive in determining incremental effect of $TeO_2$ on TCE. | Tellurium is toxic Tellurium is expensive. |
| $Ge_{1-x}Te_xO_{2+y}$ | Densification and stiffening may be associated with $Te^{4+}$-$Te^{6+}$ transition near room temperature. Only one source reports TCD which may not be directly related to TCE. May be a thermal expansion anomaly. Other sources report negative TCE. Diluting in $GeO_2$ may be instructive in determining incremental effect of $TeO_2$ on TCE. | Tellurium is toxic Tellurium is expensive. |
| $Si_{1-3x-y}Ge_yZn_xP_{2x}O_2$ | Combination of three positive TCE materials. | Excess P can be added to achieve P=O linkages to remove strained bonds. |

TABLE 3-continued

| Additive | Expected Effect | Comments |
| --- | --- | --- |
| $Si_{1-x}P_xO_{2-y}F_y$ | F increases TCE. Combination of F and P reported to remove strained bonds and minimize Rayleigh scattering. | Low Rayleigh scattering optical materials. Potentially commercially available. |
| $Si_{1-x}P_xO_{2-x}N_x$ | N increases cross linking increasing the overall modulus of elasticity. Uncertain effect on TCE. | May be valuable for TC-BAW to minimize interface losses due to differences in elastic constant. |
| Si—O—C | C increases cross linking increasing the overall modulus of elasticity. Uncertain effect on TCE. | May be valuable for TC-BAW to minimize interface losses due to differences in elastic constant. |
| $Si_{1-2y}Al_xP_xO_4$ | $AlPO_4$ shows cristobalite structure but shows tendency for octahedral coordination at high $Al^{3+}$ concentrations. | Excess P can be added to achieve P=O linkages to remove strained bonds. |
| $Si_{1-2y}Ga_xP_xO_4$ | $GaPO_4$ shows cristobalite structure and $Ga^{3+}$ shows less tendency for octahedral coordination than $Al^{3+}$. | Excess P can be added to achieve P=O linkages to remove strained bonds. |
| $Si_{1-2y}Ga_{y-x}B_xP_yO_4$ | Gallium modified BPSG. Combination of Ga and B allow for approximately achieving average ionic size of $Al^{3+}$ without the tendency for octahedral coordination. | Excess P can be added to achieve P=O linkages to remove strained bonds. |
| $Si_{1-2y}Ga_{y-x}B_xP_yO_{4-z}E_z$ | Fluorinated version of above. | F added for TCE and to minimize Rayleigh scattering |
| $BeF_2$ | Very positive TCE reported. Uncertain loss. | Be is toxic. |

What is claimed is:

1. An acoustic wave device comprising:
a piezoelectric material; and
a second material disposed on the piezoelectric material and having a temperature coefficient of frequency of a sign opposite a sign of a temperature coefficient of frequency of the piezoelectric material, the second material including one or more of $Si_{1-x-y}Ti_xP_yO_{2-z}F_z$ (x,y,z<0.1), $Si_{1-x-y}Ge_xP_yO_{2-z}F_z$, $Si_{1-x-y}B_xP_yO_{2-z}F_z$ (x=y<0.04), $Si_{1-3x}Zn_xP_2xO_{2-y}F_y$, $Si_{1-x}P_xO_{2-y}F_y$, $Si_{1-2y}Ga_xP_xO_4$, $Si_{1-2y}Ga_{y-x}B_xP_yO_4$, $Si_{1-2y}Ga_{y-x}B_xP_yO_{4-z}F_z$, $TiNb_{10}O_{29}$, $Si_{1-x}Ti_xO_{2-y}F_y$, $Si_{1-x-y}Ti_xP_yO_2$, $Si_{1-x}B_xO_{2-y}F_y$, $Si_{1-x-y}B_xP_yO_2$, $GeO_2$, $GeO_{2-y}F_y$, $Si_{1-x}Ge_xO_2$, $Si_{1-x}Ge_xO_{2-y}F_y$, $Si_{1-x-y}Ge_xP_yO_{02}$, $ZnP_2O_6$, $Si_{1-3x}Zn_xP_{2x}O_2$, $Ge_{1-3x}Zn_xP_{2x}O_2$, $Si_{1-x}Te_xO_{2+y}$, $Ge_{1-x}Te_xO_{2+y}$, $Si_{1-3x-y}Ge_yZn_xP_{2x}O_2$, $Si_{1-x}P_xO_{2-x}N_x$, Si—O—C, $Si_{1-2y}Al_xP_xO_4$, or $BeF_2$.

2. The acoustic wave device of claim 1 configured as a surface acoustic wave device.

3. The acoustic wave device of claim 1 configured as a bulk acoustic wave device.

4. An acoustic wave device comprising:
a piezoelectric material; and
a second material disposed on the piezoelectric material and having a temperature coefficient of frequency of a sign opposite a sign of a temperature coefficient of frequency of the piezoelectric material, the second material including one or more of $Si_{1-x-y}Ti_xP_yO_{2-z}F_z$ (x,y,z<0.1), $Si_{1-x-y}Ge_xP_yO_{2-z}F_z$, $Si_{1-x-y}B_xP_yO_{2-z}F_z$ (x=y<0.04), $Si_{1-3x}Zn_xP_{2x}O_{2-y}F_y$, $Si_{1-x}P_xO_{2-y}F_y$, $Si_{1-2y}Ga_xP_xO_4$, $Si_{1-2y}Ga_{y-x}B_xP_yO_4$, $Si_{1-2y}Ga_{y-x}B_xP_yO_{4-z}F_z$.

5. The acoustic wave device of claim 4 configured as a surface acoustic wave device.

6. The acoustic wave device of claim 4 configured as a bulk acoustic wave device.

7. The acoustic wave device of claim 4 wherein the second material includes one or more of $Si_{1-x-y}Ti_xP_yO_{2-z}F_z$ (x,y,z<0.1) or $Si_{1-x-y}Ge_xP_yO_{2-z}F_z$.

8. The acoustic wave device of claim 4 wherein the second material includes one or more of $Si_{1-3x}Zn_xP_{2x}O_{2-y}F_y$ or $Si_{1-2y}Ga_xP_xO_4$.

9. The acoustic wave device of claim 4 wherein the second material includes one or more of $Si_{1-2y}Ga_{y-x}B_xP_yO_4$ or $Si_{1-2y}Ga_{y-x}B_xP_yO_{4-z}F_z$.

10. An acoustic wave device comprising:
a piezoelectric material; and
a second material disposed on the piezoelectric material and having a temperature coefficient of frequency of a sign opposite a sign of a temperature coefficient of frequency of the piezoelectric material, the second material including one or more of $Si_{1-x}Ti_xO_{2-y}F_y$, $Si_{1-x-y}Ti_xP_yO_2$, $Si_{1-x-y}B_xP_yO_2GeO_{2-y}F_y$, $Si_{1-x}Ge_xO_2$, $Si_{1-x}Ge_xO_{2-y}F_y$, $Si_{1-x-y}Ge_xP_yO_2$, $ZnP_2O_6$, $Si_{1-3x}Zn_xP_{2x}O_2$, $Ge_{1-3x}Zn_xP_{2x}O_2$, $Si_{1-x}TeO_xO_{2+y}$, $Ge_{1-x}Te_xO_{2+y}$, $Si_{1-3x-y}Ge_yZn_xP_{2x}O_2$, $Si_{1-2y}Al_xP_xO_4$, or $BeF_2$.

11. The acoustic wave device of claim 10 configured as a surface acoustic wave device.

12. Acoustic wave device of claim 10 configured as a bulk acoustic wave device.

13. The acoustic wave device of claim 10 wherein the second material includes one or more of $Si_{1-x}Ti_xO_{2-y}F_y$ or $Si_{1-x-y}Ti_xP_yO_2$.

14. The acoustic wave device of claim 10 wherein the second material includes one or more of $Si_{1-x-y}B_xP_yO_2$ or $GeO_{2-y}F_y$.

15. The acoustic wave device of claim 10 wherein the second material includes one or more of $Si_{1-x}Ge_xO_2$ or $Si_{1-x-y}Ge_xP_yO_2$.

16. The acoustic wave device of claim 10 wherein the second material includes one or more of $Si_{1-3x}Zn_xP_2O_2$ or $Ge_{1-3x}Zn_xP_{2x}O_2$.

17. The acoustic wave device of claim 10 wherein the second material includes one or more of $Si_{1x}Te_xO_{2+y}$, or $Ge_{1x}Te_xO_{2+y}$.

18. The acoustic wave device of claim 10 wherein the second material includes $Si_{1-3x-y}Ge_yZn_xP_{2x}O_2$.

19. The acoustic wave device of claim 10 wherein the second material includes one or more of $Si_{1-2y}Al_xP_xO_4$, or $BeF_2$.

20. The acoustic wave device of claim 10 wherein the second material includes one or more of $Si_{1-x}Ge_xO_{2-y}F_y$, or $ZnP_2O_6$.

21. An acoustic wave device comprising:
a piezoelectric material; and
a second material disposed on the piezoelectric material and having a temperature coefficient of frequency of a sign opposite a sign of a temperature coefficient of frequency of the piezoelectric material, the second material including one or more of $Si_{1-x-y}Ti_xP_yO_{2-z}F_z$ (x, y, z<0.1) or $Si_{1-x-y}Ge_xP_yO_{2-z}F_z$.

22. An acoustic wave device comprising:
a piezoelectric material; and
a second material disposed on the piezoelectric material and having a temperature coefficient of frequency of a sign opposite a sign of a temperature coefficient of frequency of the piezoelectric material, the second material including one or more of $Si_{1-3x}Zn_xP_{2x}O_{2-y}F_y$ or $Si_{1-2y}Ga_xP_xO_4$.

* * * * *